United States Patent
Jensen

(10) Patent No.: US 7,403,962 B2
(45) Date of Patent: Jul. 22, 2008

(54) INTERPOLATION FILTER DESIGN AND APPLICATION

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 732 days.

(21) Appl. No.: 10/856,024

(22) Filed: May 28, 2004

(65) Prior Publication Data

US 2005/0267924 A1      Dec. 1, 2005

(51) Int. Cl.
*G06F 17/17* (2006.01)
(52) U.S. Cl. .................................. 708/313
(58) Field of Classification Search .............. 708/313
See application file for complete search history.

(56) References Cited

U.S. PATENT DOCUMENTS

| | | | | |
|---|---|---|---|---|
| 4,270,026 A | * | 5/1981 | Shenoi et al. .......... | 704/265 |
| 5,574,572 A | * | 11/1996 | Malinowski et al. ...... | 358/451 |
| 5,717,617 A | * | 2/1998 | Chester .................. | 708/313 |
| 2002/0116427 A1 | * | 8/2002 | Jiang et al. ............ | 708/313 |

* cited by examiner

*Primary Examiner*—Tan V Mai
(74) *Attorney, Agent, or Firm*—Garlick Harrison & Markison; Timothy W. Markison; Kevin L. Smith

(57) ABSTRACT

A method for designing an interpolation filter begins by partitioning interpolation filtering into a plurality of interpolation filtering stages that are cascaded together. Each of the plurality of interpolation filtering stages includes an up sampling stage and a filtering stage. The method continues by manipulating a first one of the interpolation filtering stages based on a first digital signal processing identity to produce a first equivalent interpolation filtering stage. The method continues by manipulating a second one of the interpolation filtering stages based on the first digital signal processing identity to produce a second equivalent interpolation filtering stage. The method continues by simplifying the first and second equivalent interpolation filtering stages to produce at least a simplified portion of the interpolation filter.

17 Claims, 9 Drawing Sheets

RF transmitter 50 digital BB processing module 52 interpolation filter 96 or 98 example interpolation filter example interpolation filter (cont.)

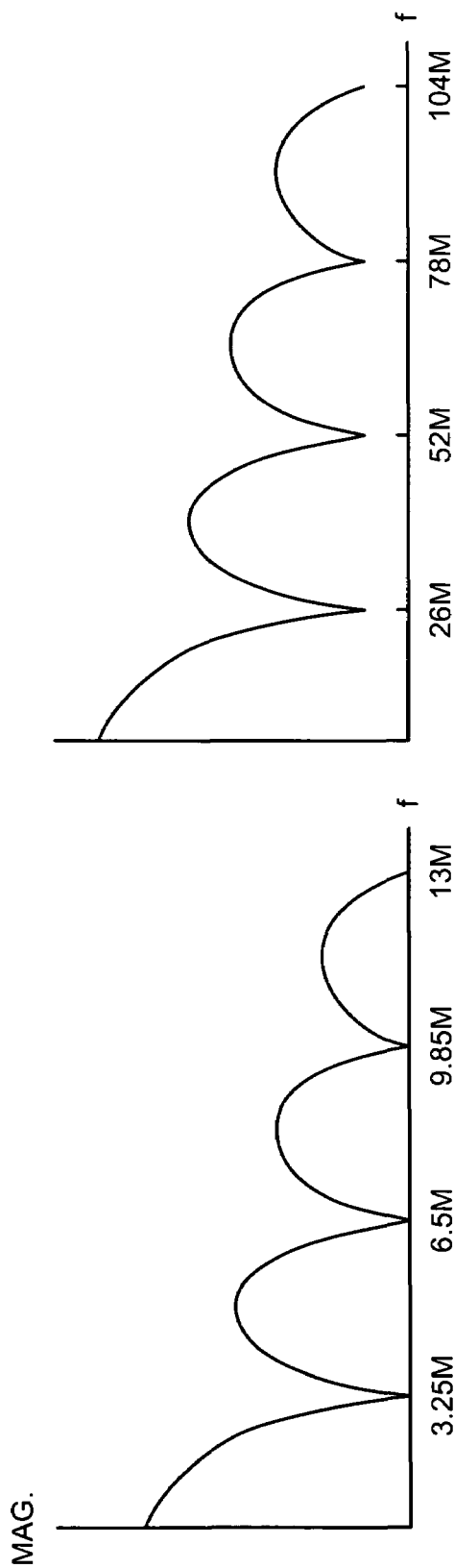
FIG. 7
example LPF1 response
(3rd order comb filter)
FIG. 8
example LPF2 response
(2nd order comb filter)
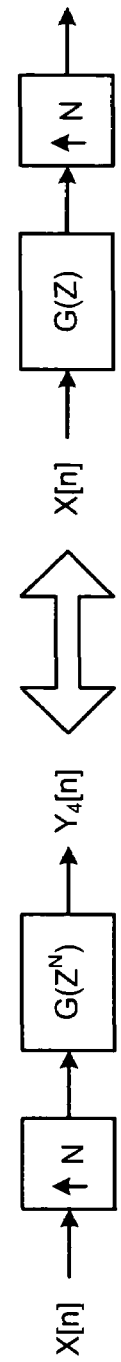
FIG. 9
Noble identity example interpolation filter manipulated using noble identity signal processing equivalence example interpolation filter manipulated
using signal processing equivalence 2nd example interpolation filter

INTERPOLATION FILTER DESIGN AND APPLICATION

BACKGROUND OF THE INVENTION

1. Technical Field of the Invention

This invention relates generally to wireless communication systems and more particularly to filtering that may be used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna. In one embodiment, the transmitter may be implemented as a translational loop transmitter.

A translational loop transmitter includes a digital processor, digital to analog converter (DAC), low pass filter, and a phase locked translational loop. The digital processor, in general, produces a digital version of the desired RF spectrum at some intermediate frequency (e.g., 26 MHz for GSM). The DAC converts the digital signals into the analog domain, which are subsequently filtered by the low pass filter. The phase locked translational loop translates the frequency of the analog signals outputted by the low pass filter to the desired radio frequencies.

For example GSM utilizes a modulation format of binary phase modulation with Gaussian pulse shaping. In this instance, the binary baseband data is transmitted at a rate of 270.833 kilobits-per-second and is pulse-shaped using a Gaussian filter (GF) clocked at 3.25 MHz, the resulting, which produces a 12-fold up-sampling. In general, when up-sampling (e.g., by 12), from a sequence X[n] to a sequence Y[n], zeros are inserted between the samples of the sequence X[n] to form Y[n]. For example, for up-sampling by 12, eleven zeros are inserted between the sampling sequence of X[n].

$$y[n] = \begin{cases} x[n/12], & n = i \times 12 \\ 0 & \text{else} \end{cases}$$

For example, assume x[n]= . . . 3,5,1,7,8, . . .

For this value of X[n], the 12-fold up-sampled sequence Y[n] is x[n]= . . . 3,0,0,0,0,0,0,0,0,0,0,0,5,0,0,0,0,0,0,0,0,0,0,0, 0,1,0,0,0,0,0,0,0,0,0,0,0,7,0,0,0,0,0,0,0,0,0,0,0,8,0,0 . . .

In general, when up-sampling by an arbitrary factor N, $$y[n] = \begin{cases} x[n/N], & n = i \times N \\ 0 & \text{else} \end{cases}.$$

The combined block consisting of an up-sampler and a filter is referred to as an interpolation filter. The filter portion is needed since N-fold up-sampling creates N−1 undesired images of the signal at evenly spaced frequency intervals.

Interpolation filters may be used within radio frequency transmitters and have a significant role in the modulation performed by such transmitters. As such, an interpolation filter should be designed to be frequency selective while maintaining linear phase response in order not to cause distortion of the transmitted signal. A popular class of filters for this application is finite impulse response filters because of their inherent linear phase response. In addition, an interpolation filter should also be of sufficiently wide bandwidth to avoid significant magnitude distortion. If the filter "droops" over the signal band, magnitude distortion occurs and this may lead to modulation errors. While FIR filters are typically used as interpolation filters, they require a large number of multiplications and additions to perform narrow band frequency selective low pass filtering as typically required by high performance interpolation filters. As is generally known, the number of multiplications and additions needed per clock cycle of an FIR filter is directly related to power consumption and required chip area. For low power and low cost radio frequency transmitters, it is desirable to reduce the hardware complexity of interpolation filters.

As is generally understood in the wireless communication art, wireless communication devices, since they are battery powered, have strict minimal power consumption requirements. Further, the performance requirements for wireless communication devices are ever-increasing, which is typically at odds with the low power consumption since higher performance typically means more circuitry that consumes more power. This is true for interpolation filters that include a relatively large number of multipliers to provide the desired level of filtering.

Therefore, a need exists for a low power interpolation filter design that is capable of performing narrow band frequency selective filtering without using a large number of multipliers.

BRIEF SUMMARY OF THE INVENTION

The interpolation filter design and application of the present invention substantially meets these needs and others. In one embodiment, a method for designing an interpolation filter begins by partitioning interpolation filtering into a plurality of interpolation filtering stages that are cascaded together. Each of the plurality of interpolation filtering stages includes an up sampling stage and a filtering stage. The method continues by manipulating a first one of the interpolation filtering stages based on a first digital signal processing identity to produce a first equivalent interpolation filtering stage. The method continues by manipulating a second one of the interpolation filtering stages based on the first digital signal processing identity to produce a second equivalent interpolation filtering stage. The method continues by simplifying the first and second equivalent interpolation filtering stages to produce at least a simplified portion of the interpolation filter.

In another embodiment, a method for designing an interpolation filter begins by determining an overall up-sampling rate and an overall low pass filtering response for the interpolation filter. The method continues by selecting a first up-sampling rate based on one of a plurality of clock frequencies, the overall up-sampling rate, and data rate of data being filtered by the interpolation filter. The method continues by determining a first low pass filtering response based on the overall low pass filtering response and the data rate. The method continues by selecting a second up-sampling rate based on the overall up-sampling rate and the first up-sampling rate. The method continues by determining a second low pass filtering response based on the overall low pass filtering response and the first up-sampling rate. The method continues by mathematically reducing the first up-sampling rate, the first low pass filtering response, the second up-sampling rate, and the second low pass filtering response based on at least one digital signal processing identity to produce the interpolation filter.

BRIEF DESCRIPTION OF THE SEVERAL VIEWS OF THE DRAWINGS

FIGS. 5-12 illustrate an example of interpolation filter in accordance with the present invention;

DETAILED DESCRIPTION OF THE INVENTION

Figure 1:
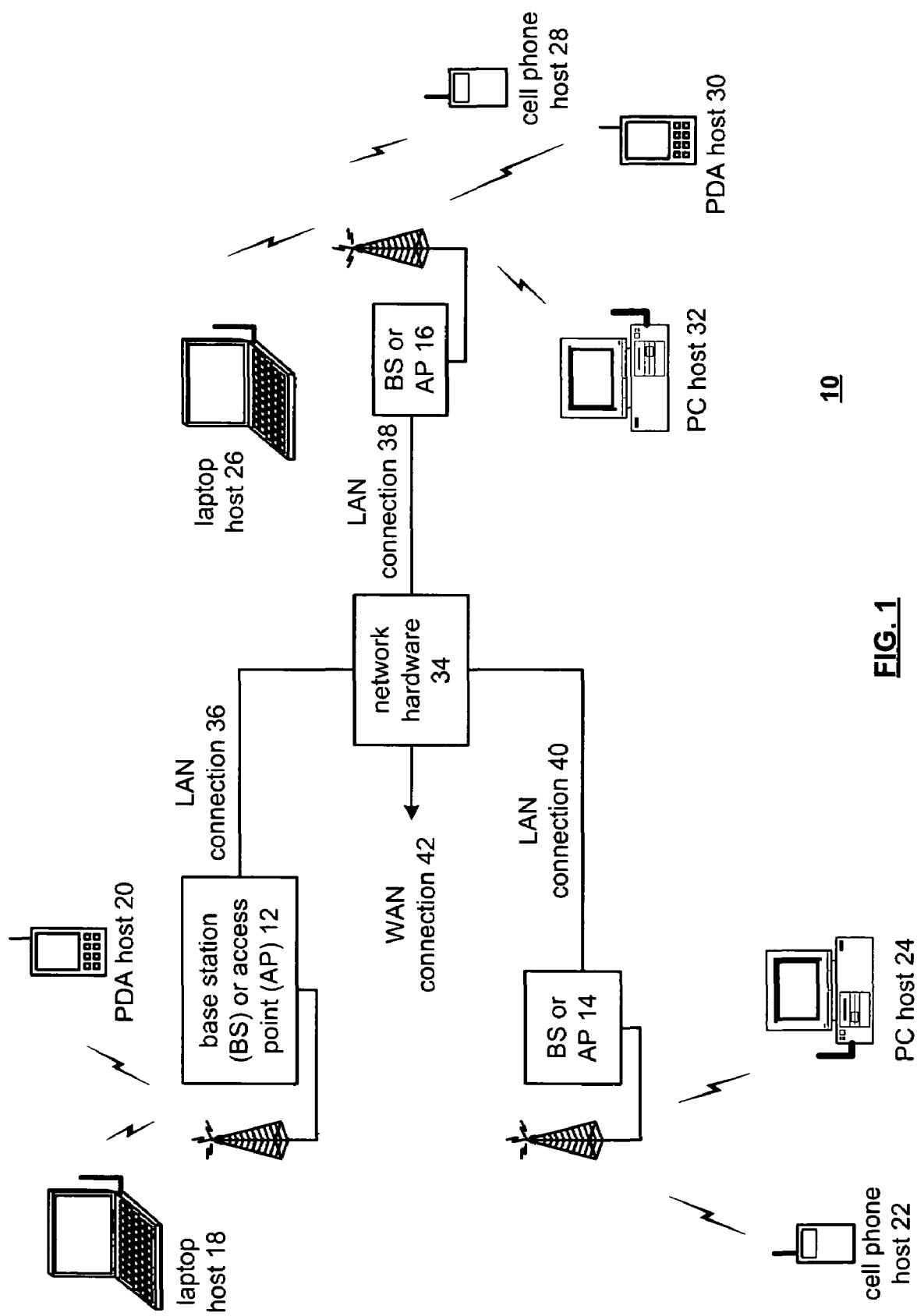
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
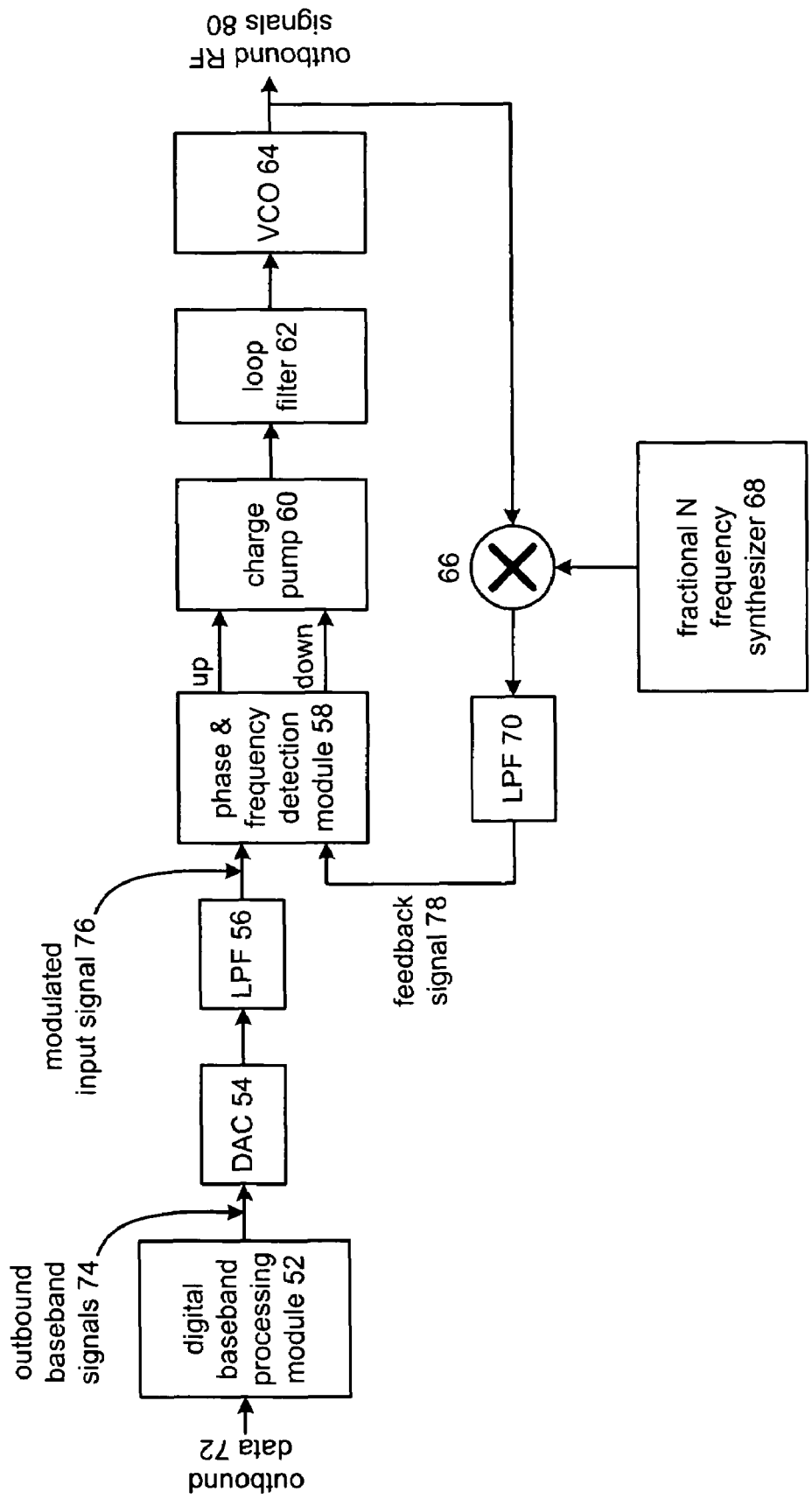
FIG. 2 is a schematic block diagram of an RF transmitter in accordance with the present invention.

FIG. 2 is a schematic block diagram of a radio frequency (RF) transmitter 50 that may be incorporated in a radio portion of a wireless communication device. The wireless communication device may also include the host device 18-32, which for cellular telephone hosts, the radio is a built-in component of the host and, for personal digital assistants hosts, laptop hosts, and/or personal computer hosts, the radio may be built-in or an externally coupled component.

The host device 18-32 may include a processing module, memory, a radio interface, an input interface, and an output interface. The processing module and memory execute the corresponding instructions that are typically done by the host device. For example, for a cellular telephone host device, the processing module performs the corresponding communication functions in accordance with a particular cellular telephone standard.

The radio interface of the host device allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera such that the received data may be displayed. The radio interface also provides data from the processing module to the radio. The processing module may receive the outbound data from an input device such as a keyboard, keypad, microphone, et cetera via the input interface or generate the data itself. For data received via the input interface, the processing module may perform a corresponding host function on the data and/or route it to the radio via the radio interface.

The radio may include a host interface, a receiver section, the RF transmitter 52, a local oscillation module, memory, a transmit/receive switch, and an antenna structure. The receiver section may include a digital receiver processing module, an analog-to-digital converter, a filtering/gain module, an IF mixing down conversion stage, a receiver filter, and a low noise amplifier. The RF transmitter 52 includes a digital baseband processing module 52, a digital-to-analog converter 54, a low pass filter 56, a phase and frequency detection module 58, a charge pump 60, a loop filter 62, a voltage controlled oscillation 64, a mixer 66, a fractional-N frequency synthesizer module, and a low pass filter 70. The RF transmitter 52 may further include a power amplifier to amplify the RF output of the voltage controlled oscillator 64. The antenna structure may be a single antenna that is shared by the transmit and receive paths as regulated by the transmit/receive switch, or may include separate antennas for the transmit path and receive path. The antenna implementation will depend on the particular standard to which the wireless communication device is compliant.

The digital receiver processing module and the digital baseband processing module 52, in combination with operational instructions stored in memory, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions, as will be described in greater detail with reference to FIGS. 3-15, include, but are not limited to, scrambling, encoding, constellation mapping, modulation, digital filtering, and/or digital baseband to IF conversion. The digital receiver and baseband processing modules may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the digital baseband processing module 52, which will be discussed in greater detail with reference to FIG. 3, converts outbound data 72 into outbound baseband signal 74 in accordance with a wireless communication standard (e.g., Bluetooth, GSM, 802.11, et cetera). The digital-to-analog converter 54 converts the outbound baseband signals 74 into analog signals which are subsequently filtered via the low pass filter 56 to produce modulated input signals 76.

The phase and frequency detection module 58 compares the phase and frequency of the modulated input signal 76 with the phase and frequency of feedback signal 78. When a phase difference occurs, the phase and frequency detection module 58 creates an up-signal or a down-signal. The phase and frequency detection module 58 creates the up-signal when the frequency of the outbound RF signals 80 needs to be increased which occurs when the phase and/or frequency of the modulated input signal 76 leads the feedback signal 78. Conversely, when the frequency of the outbound RF signals 80 needs to be decreased, which occurs when the phase and/or frequency of the feedback signal 78 leads the phase and/or frequency of the modulated input signal 76, the phase and frequency detection module 58 creates the down-signal.

The charge pump 60 converts the up-signal and the down-signal into a current. The loop filter 60 converts the current into a control voltage. The voltage controlled oscillator 64 converts the control voltage into the outbound RF signals 80. Note that for PCS 1900 and/or DCS 1800 operation in accordance with the GSM standard, the frequency of the outbound RF signals 80 may be approximately 1.8 GHz. For GSM 900 or GSM 850 operations, the frequency of the outbound RF signals 80 may be approximately 900 MHz.

The fractional-N synthesizer 68 creates a divider value, which includes a fractional portion that when multiplied by multiplier 66 with the outbound RF signals 80, produces a sinusoidal signal that has frequencies at the difference of the inputs to the multiplier 66 and at frequencies equal to the sum of the frequencies of the input of multiplier 66. The low pass filter 70 filters out the high frequency signal components of the output of multiplier 66 to produce feedback signals 78.

Figure 3:
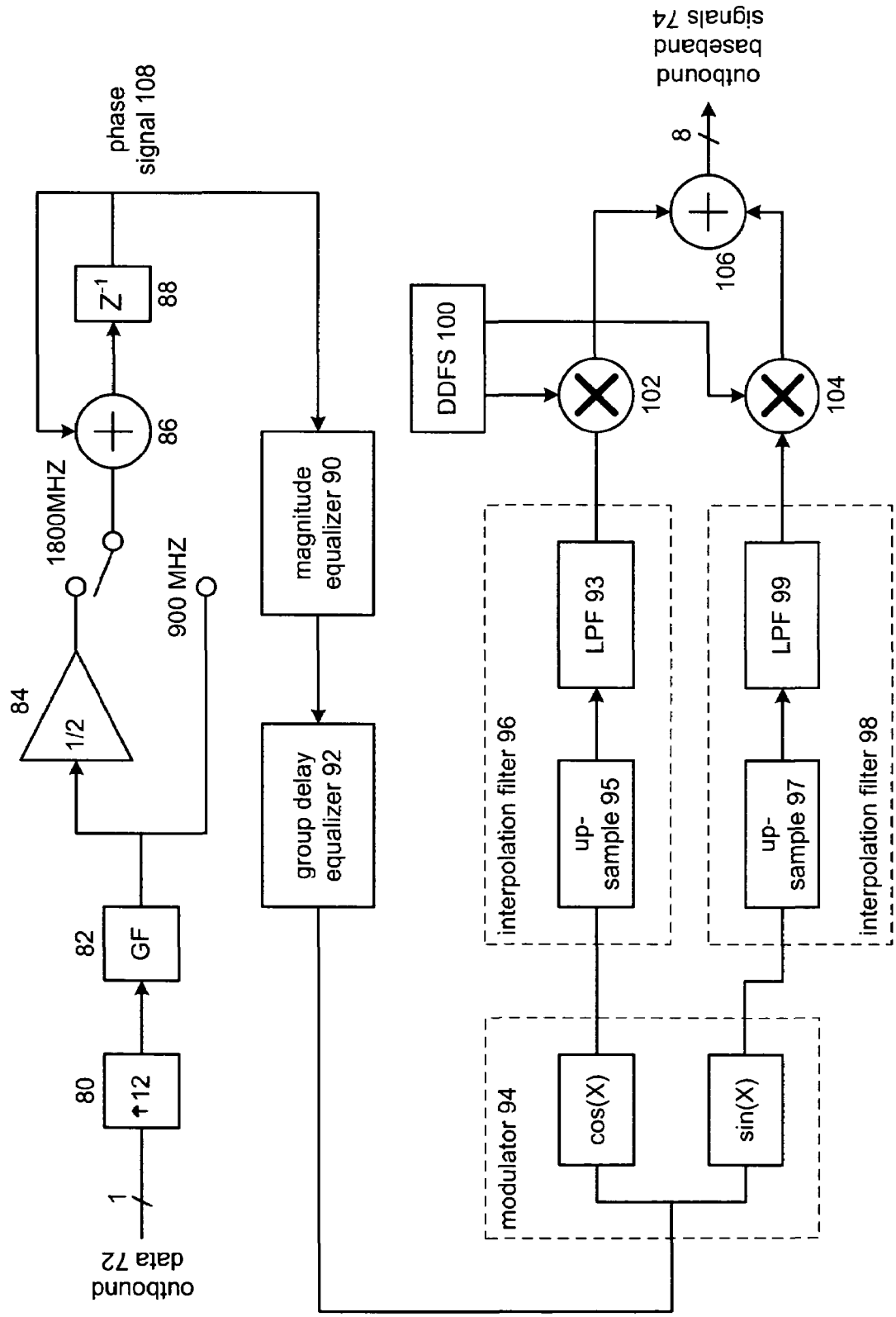
FIG. 3 is a schematic block diagram of a digital baseband processing module in accordance with the present invention.

FIG. 3 is a schematic block diagram of the functional operation of the digital baseband processing module 52. In this embodiment, the digital baseband processing module 52 includes a 12-fold up-sampling module 80, a Gaussian filter (GF) 82, a frequency divider module 84, a switch module, a differentiator that includes the summation module 86 and delay element 88, magnitude equalizer 90, group delay equalizer 92, modulator 94, interpolation filters 96 and 98, a direct digital frequency synthesizer (DDFS) 100, two mixers 102 and 104 and a summation module 106 to produce the outbound baseband signals 74 as 8-bit digital values at a rate of approximately 270 kilobits-per-second.

Each of the interpolation filters 96 and 98 include up-sampling modules 95 and 97 and low pass filters 93 and 99. The up-sampling modules 95 and 97 and low pass filters 93 and 99 of interpolation filters 96 and 98 may be implemented in accordance with the present invention as further described with reference to FIGS. 4-15.

Figure 4:
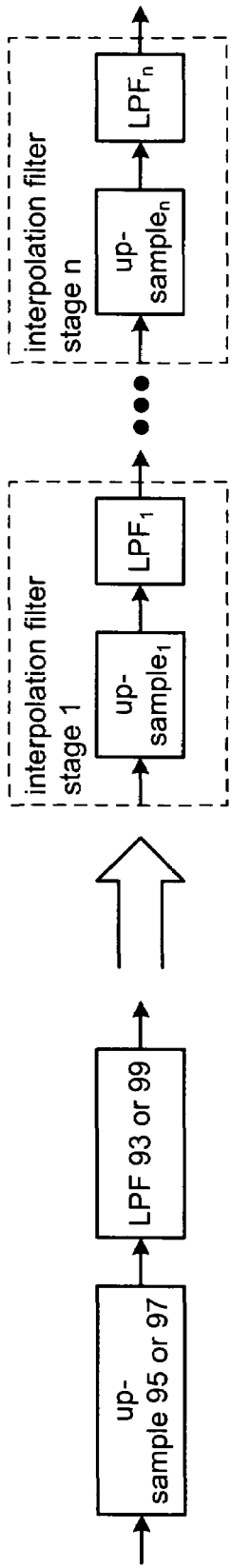
FIG. 4 is a diagram of an interpolation filter in accordance with the present invention.

FIG. 4 illustrates an equivalent circuit of interpolation filter 96 or 98. As shown in FIG. 3, the interpolation filter 96 or 98 includes an up-sampling module 95 or 97 and a low pass filter 93 or 99. In an equivalent structure, the interpolation filter 96 or 98 may be separated into a plurality of interpolation filter stages. Each interpolation filter stage includes an up-sampling module and a corresponding low pass filter. As is shown, the interpolation filter stages are cascaded together. With the equivalent circuit of the interpolation filter including a plurality of interpolation filter stages, the stages may be manipulated to simplify the overall implementation of the interpolation filter. This may be further described with reference to the examples of FIGS. 5-12 and the example of FIG. 13.

Figure 5:

FIG. 5 is an example of an interpolation filter that includes a 104 up-sampling module followed by a low pass filter. In this example, the rate of the input data may be at 3.25 MHz and the rate of the output data may be at 338 MHz. An equivalent interpolation filter is shown to have two stages.

The 1st stage includes an 8-fold up-sampling module followed by a 1st low pass filter. The 2nd stage includes a 13-fold up-sampling module followed by a 2nd low pass filter. The particular filtering performed by low pass filters 1 and 2 are dependent on the particular application in which the interpolation filter is used. For example, if the interpolation filter is used in a GSM transceiver as the one illustrated in FIGS. 2 and 3, the 1st low pass filter may be a 3rd order comb filter and the 2nd low pass filter may be a 2nd order comb filter.

Figure 6:
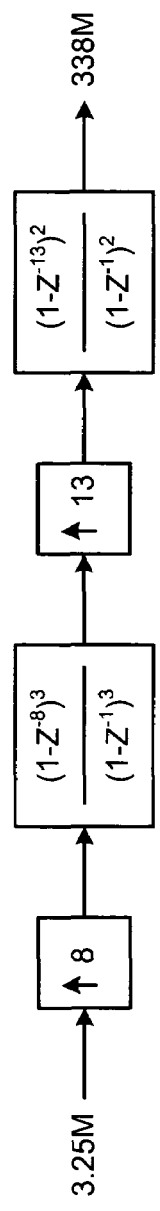

FIG. 6 illustrates a continuation of the example interpolation filter where the 1st low pass filter is shown as the 3rd order comb filter and the 2nd low pass filter is shown as a 2nd order comb filter.

FIGS. 7 and 8 illustrate the responses of the 1st and 2nd low pass filters accordingly. Note that the notches of the 1st low pass comb filter occur at multiples of the rate of the input data to attenuate the images of the input data produced by the up-sampling of the 8-fold up-sampling module. The notches of the 2nd low pass filter occur at multiples of 26 MHz which correspond to the frequencies of the images produced by the 13-fold up-sampling of the input it receives. Note that the input received by the 13-fold up-sampling module is at a rate of 26 MHz (3.25×8=26).

FIG. 9 illustrates a diagram of a digital signal processing identity generally referred to as a Noble identity. In this illustration, an N-fold up-sampler is followed by a filter having the response of $G(z^N)$ to produce an output. The equivalent circuit may be achieved by placing the filter prior to the up-sampling module wherein the rate of the filter is at the rate of the input. Based on this Noble identity, the example interpolation module of FIG. 6 may be modified as shown in FIG. 10.

Figure 10:
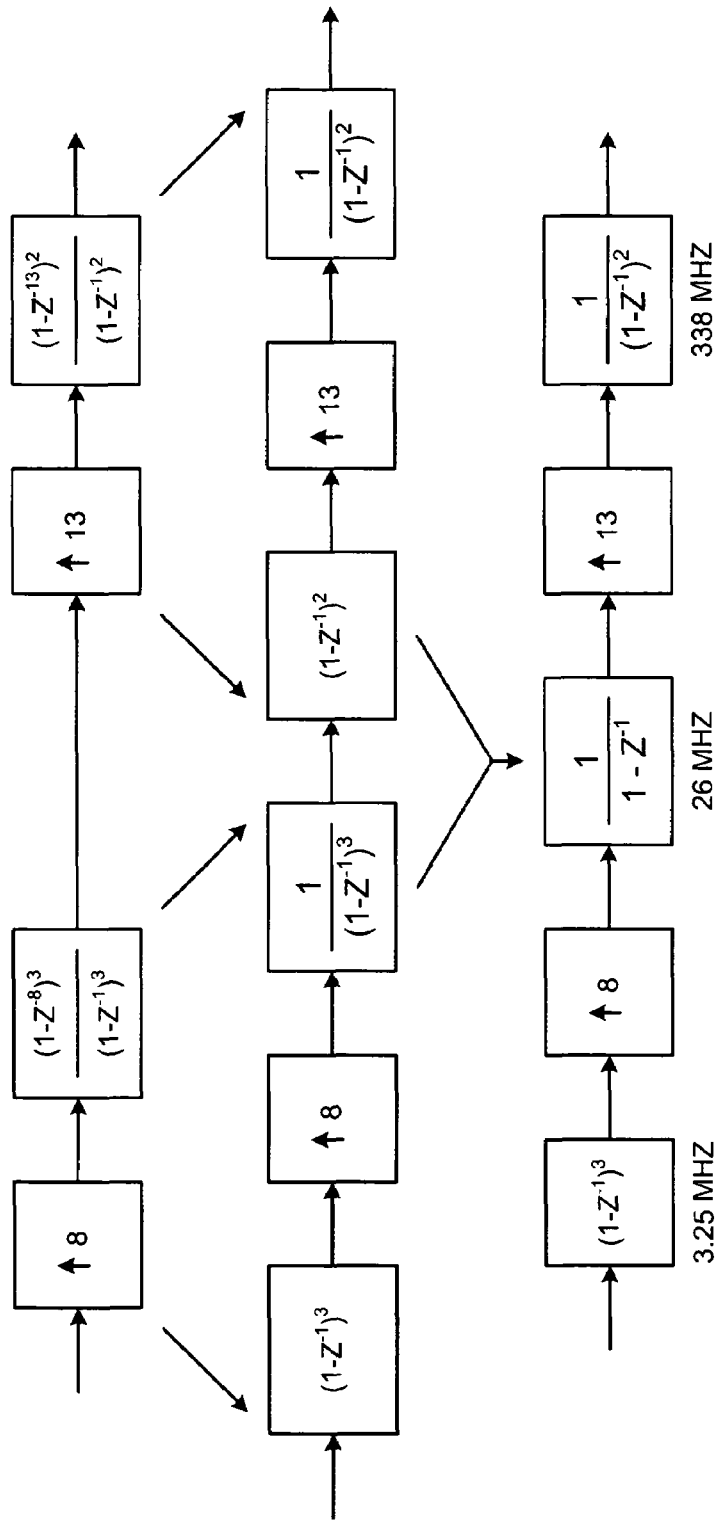
Figure 10:
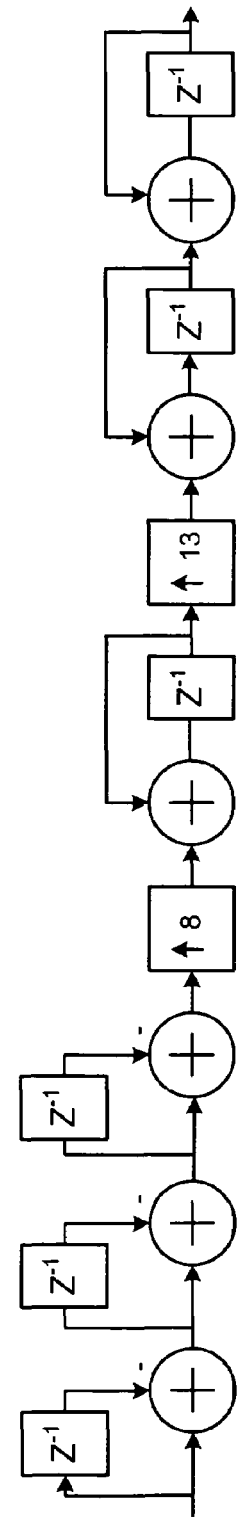

FIG. 10 illustrates a simplification process of the interpolation filter of FIG. 6 based on the Noble identity. The top of the page illustrates the interpolation filter as shown in FIG. 6 including an 8-fold up-sampling module followed by a 3rd order comb filter, followed by a 13-fold up-sampling module, followed by a 2nd order comb filter. Based on the Noble identity, the low pass comb filters may be rearranged with respect to the 8-fold up-sampling module and with respect to the 13-fold up-sampling module as shown. The resulting equivalent circuit includes a 3-stage differentiator followed by the 8-fold up-sampling module, followed by a 3rd order integrator, followed by a 2nd order differentiator, followed by the 13-fold up-sampler, followed by a 2nd order integrator.

Due to the linear structure of the equivalent interpolation filter, the 2nd order integrator may be combined with the 3rd order differentiator to produce a 1st order integrator.

FIG. 10 further illustrates a schematic implementation of the filter to include 3 differentiators cascaded together to provide the 3rd order differentiator, followed by the 8-fold up-sampler, followed by a 1st order integrator, followed by the 13-fold up-sampler followed by 2 integrators to provide the 2nd order integrator. The equivalent circuit of FIG. 10 provides a simplified implementation of a high performance interpolation filter in that, at a minimum, it eliminates the need for multipliers. The interpolation filter of FIG. 10 may be further simplified by utilizing another signal processing identity as shown in FIG. 11.

Figure 11:
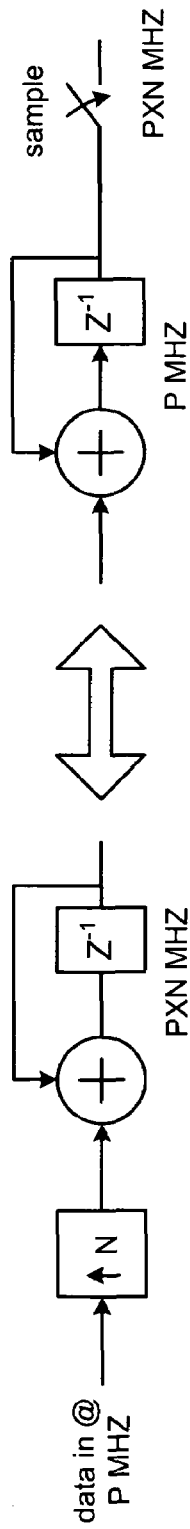

FIG. 11 illustrates a signal processing equivalence identity where an N-fold up-sampling module followed by an integrator operating at the up-sampled rate of the input data is equivalent to an integrator operating at the data rate wherein the output is sampled at the up-sampled rate. In this example, the input data is at P-megahertz and the integrator operates at P×N megahertz. In the equivalent circuit, the integrator operates at P-megahertz and its output is sampled at P×N megahertz.

Figure 12:
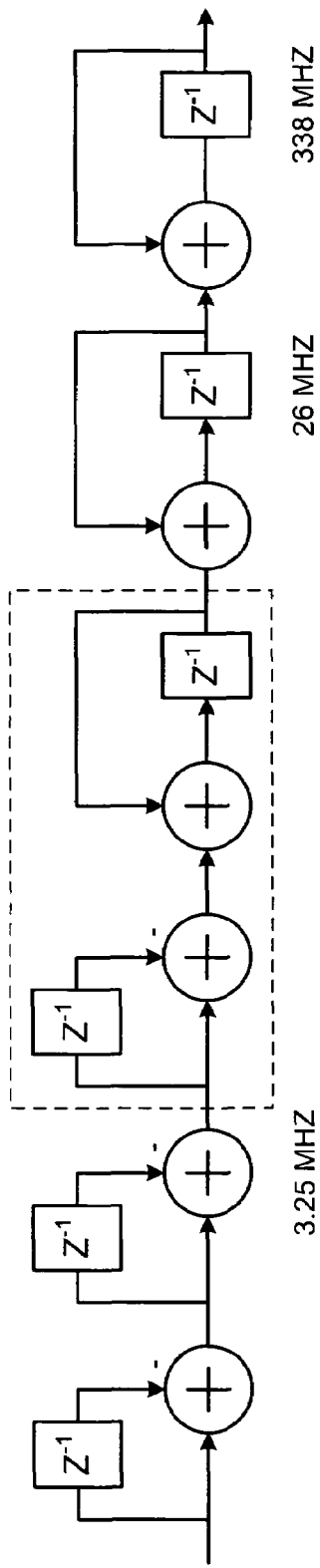
Figure 12:
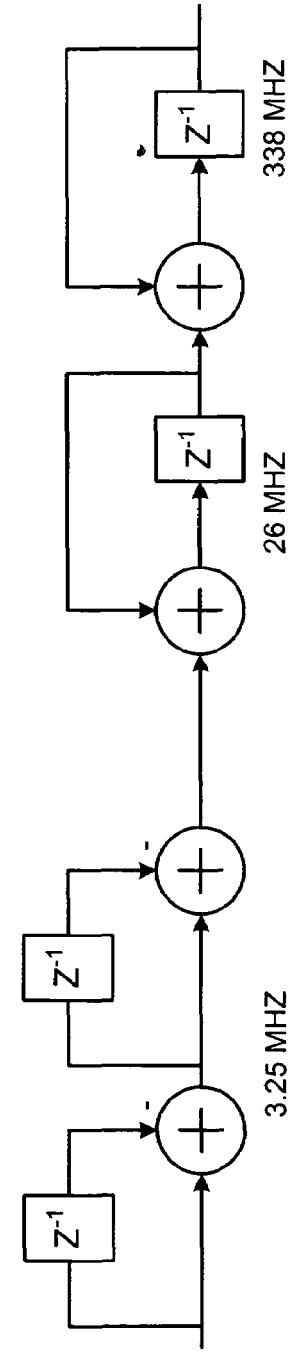

FIG. 12 illustrates a schematic block diagram of further simplification of the interpolation filter of FIG. 10 based on the signal processing equivalence identity of FIG. 11. With reference to FIGS. 10 and 11, as shown in FIG. 12, the 8-fold up-sampling module and the subsequent integrator are simplified to an integrator operating at the input data rate (e.g., 3.25 MHz). Utilizing the signal processing equivalence of FIG. 11, the up-sampling modules are removed thus yielding the circuit containing three differentiators followed by three integrators operating at various frequency rates. For example, the differentiators and the 1st integrator may be operating at 3.25 MHz, while the 2nd integrator at 26 MHz and the 3rd integrator at 338 MHz. Note that the 3rd differentiator is followed by an integrator thus essentially canceling each other. Thus, the circuit may be simplified as shown to include two differentiators operating at 3.25 MHz, an integrator operating at 26 MHz and another integrator operating at 338 MHz. In this implementation of an interpolation filter, high performance is achieved while circuit complexity and power consumption are reduced.

Figure 13:
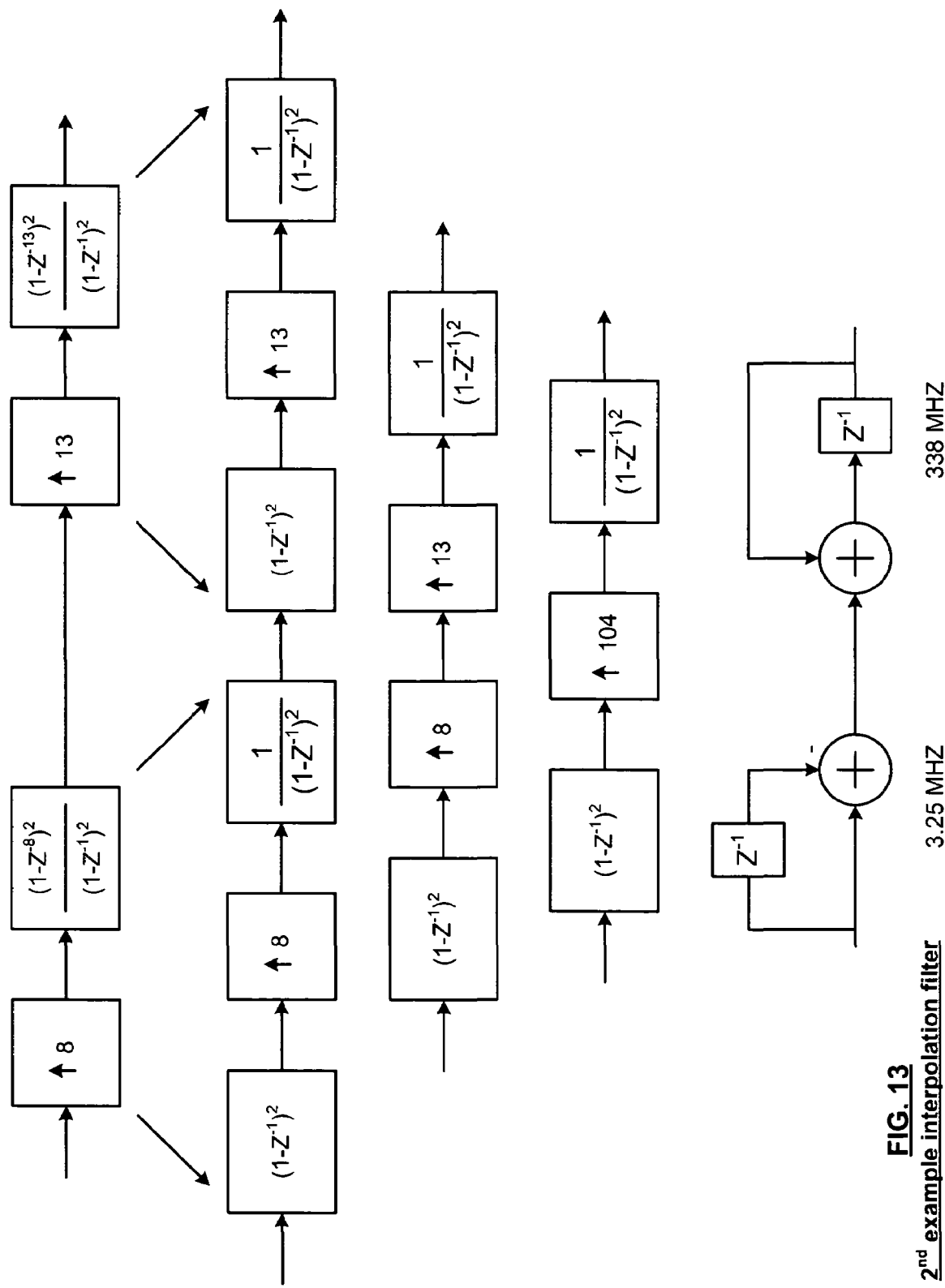
FIG. 13 is a diagram of a $2^{nd}$ example of an interpolation filter in accordance with the present invention.

FIG. 13 is a 2nd example of a high performance reduced complexity interpolation filter that begins with the 8-fold up-sampling module followed by a 2nd order comb filter, followed by a 13-fold up-sampling module, followed by a 2nd order comb filter. Applying the Noble identity, the interpolation filter includes a 2nd order differentiator, an 8-fold up-sampling module, a 2nd order integrator, a 2nd order differentiator, a 13-fold up-sampling module and a 2nd order integrator. The 2nd order integrator and 2nd order differentiator cancel each other thus yielding the circuit containing a 2nd order differentiator followed by the 8-fold up-sampling module, followed by the 13-fold up-sampling module, followed by the 2nd order integrator.

The 8-fold and 13-fold up-sampling modules may be combined to produce a 104-fold up-sampling module as shown. Utilizing the signal processing identity of FIG. 11, the up-sampling module and the integrator may be simplified as an integrator operating at a lower frequency thus yielding the differentiator operating at 3.25 MHz and an integrator operating at 338 MHz.

Figure 14:
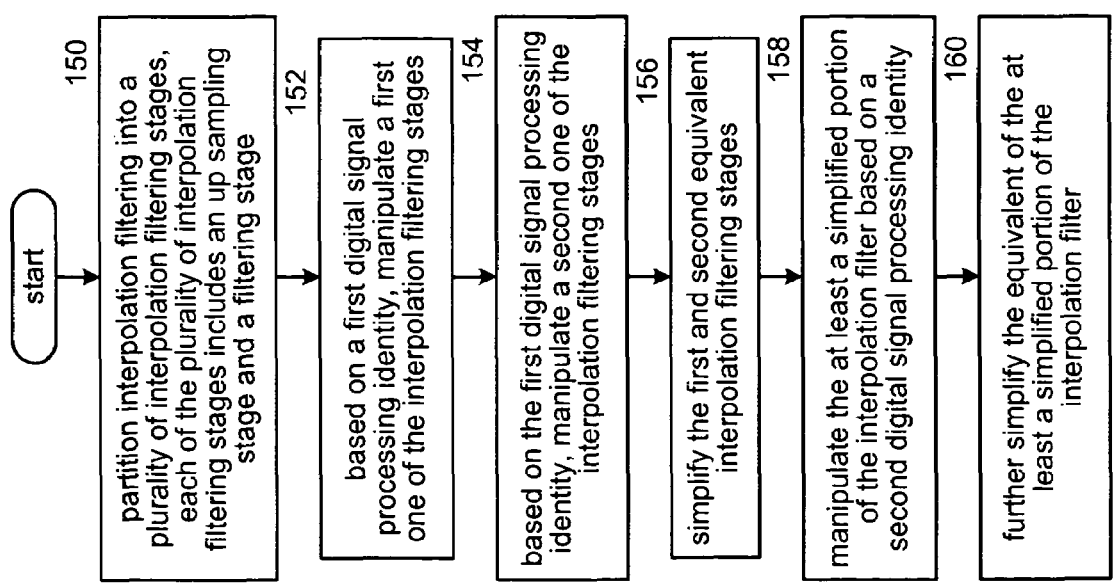
FIG. 14 is a logic diagram of a method for designing an interpolation filter in accordance with the present invention.

FIG. 14 is a logic diagram of a method for designing an interpolation filter. The process begins at Step 150 where interpolation filtering is partitioned into a plurality of interpolation filtering stages. Each of the interpolation filter stages includes an up-sampling stage and a filtering stage. Note that the interpolation filter stages are cascaded together. In one embodiment, the partitioning of the interpolation filtering may be done by partitioning the interpolation filtering into a 1st interpolation filtering stage and a 2nd interpolation filtering stage. Having partitioned the filtering stages, a 1st up-sampling rate and a corresponding up-sampling for the 1st up-sampling stage is established and a 2nd up-sampling rate is established for the 2nd up-sampling stage of the 2nd interpolation filtering stage, the product of the 1st and 2nd up-sampling stages corresponds to the overall up-sampling rate of the interpolation filter. With the up-sampling rates determined, the 1st and 2nd digital filters are generated. The 1st digital filter attenuates images produced by the 1st up-sampling stage and the 2nd digital filter attenuates images produced by the 2nd up-sampling stage. Note that the 1st and 2nd digital filters may be comb filters having frequency notches corresponding to the images produced by the corresponding up-sampling stages.

The process then proceeds to Step 152 where, based on a $1^{st}$ digital signal processing identity (e.g., Noble identity), the $1^{st}$ interpolation filter stage is manipulated to produce a $1^{st}$ equivalent interpolation filtering stage. The process then proceeds to Step 154 where, based on the $1^{st}$ digital signal processing identity, a $2^{nd}$ interpolation filtering stage is manipulated to produce a $2^{nd}$ equivalent interpolation filter stage. The manipulation of the $1^{st}$ and $2^{nd}$ interpolation filter stages may be done by rearranging a linear order of components of the $1^{st}$ digital filters with respect to the corresponding up-sampling stage of the $1^{st}$ interpolation filter stage based on a Noble identity and rearranging the linear order of components of the $2^{nd}$ digital filter with respect to the corresponding up-sampling stage of the $2^{nd}$ interpolation filter stage based on the Noble identity.

The process then proceeds to Step 156 where the $1^{st}$ and $2^{nd}$ equivalent interpolation filter stages are simplified to produce at least a simplified portion of the interpolated filter. The simplification may be done by mathematically combining at least one of the components of the $2^{nd}$ digital filter stage with at least one of the components of the $1^{st}$ digital filter stage to produce an equivalent component. Examples of the simplification were provided in FIGS. 4-13.

The process then proceeds to Step 158 where the simplified portion of the interpolation filter is manipulated based on a $2^{nd}$ digital signal processing identity (e.g., signal processing equivalence identity) to produce an equivalent simplified portion of the interpolation filter. The process then proceeds to Step 160 where the equivalent simplified portion of the interpolation filter is further simplified to produce a simplified interpolation filter. Example of the further simplification where provided with reference to FIGS. 11-13.

Figure 15:
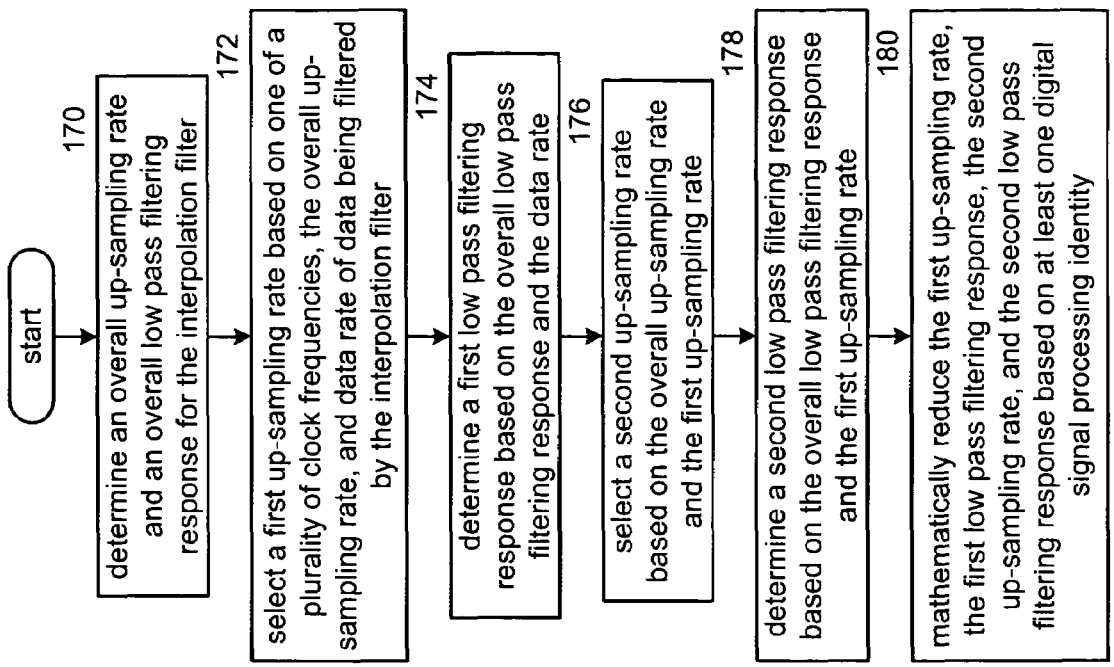
FIG. 15 is a logic diagram of an alternate method for designing an interpolation filter in accordance with the present invention.

FIG. 15 is a logic diagram of another method for designing an interpolation filter. The process begins at Step 170 where an overall up-sampling rate and an overall low pass filtering response are determined for an interpolation filter. The process then proceeds to Step 172 where a $1^{st}$ up-sampling rate is selected based on one of a plurality of clock frequencies, the overall up-sampling rate, and the data rate of data being filtered by the interpolation filter. Note that the clock frequencies may correspond to available clock signals on an integrated circuit (e.g., a radio frequency integrated circuit). The selection of the $1^{st}$ up-sampling rate may be done by establishing a relationship of the $1^{st}$ up-sampling rate multiplied by the data rate to substantially equal the rate of the selective clock frequency. For example, if an available clock rate is 26 MHz and the incoming data is 3.25 MHz, an up-sampling rate of 8 would be used.

The process then proceeds to Step 174 where a $1^{st}$ low pass filtering response is determined based on the overall low pass filtering response and the data rate. In one embodiment, the determination of the $1^{st}$ low pass filtering response may be done by establishing a comb filter having notches at frequencies corresponding to the data rate and multiples thereof and determining an order of the comb filter based on desired attenuation of the images. This was illustrated with reference to FIGS. 5-7.

The process then proceeds to Step 176 where a $2^{nd}$ up-sampling rate is selected based on the overall up-sampling rate and the $1^{st}$ up-sampling rate. This may be done by establishing a relationship of the $2^{nd}$ up-sampling rate multiplied by the rate of the clock frequencies to be substantially equal to the data rate multiplied by the overall up-sampling rate. For example, if the overall up-sampling rate is 104 and the data rate is 3.25 MHz, and the clock frequency is 26 MHz, then the $2^{nd}$ up-sampling rate is 13.

The process then proceeds to Step 178 where a $2^{nd}$ low pass filtering response is determined based on the overall low pass filtering response and the $1^{st}$ up-sampling rate. This may be done by establishing a comb filter having notches at frequencies corresponding to the rate of the selective clock frequency and multiples thereof and determining the order of the comb filter based on desired attenuation of the images. This was illustrated with reference to FIG. 8. The process then proceeds to Step 180 where the $1^{st}$ up-sampling rate, the $1^{st}$ low pass filtering response, the $2^{nd}$ up-sampling rate and the $2^{nd}$ low pass filtering response are mathematically reduced based on at least one digital signal processing identity to produce an interpolation filter. The at least one digital signal processing identity includes a Noble identity and/or equating an up-sampling function operating at a $1^{st}$ frequency linearly followed by an integration function operating at a $2^{nd}$ frequency to an integrated function operating at the $1^{st}$ frequency and sampling an output of the integration function operating at the $1^{st}$ frequency at a rate corresponding to the $2^{nd}$ frequency, where the $2^{nd}$ frequency equals the $1^{st}$ frequency times a multiplier.

As one of average skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for obtaining a simplified high performance interpolation filter. By reducing complexity of circuit design of an interpolation filter, while maintaining and/or improving the performance with respect to an FIR filter or other implementations of an interpolation filter, power consumption is reduced as well as die area. As one of average skill in the art will appreciate, other embodiments may be derived from the teaching of the present invention without deviating from the scope of the claims.

What is claimed is:

1. A method for designing an interpolation filter, the method comprises:

partitioning interpolation filtering into a plurality of interpolation filtering stages, wherein each of the plurality of interpolation filtering stages includes a corresponding up sampling stage and a corresponding filtering stage, and wherein the plurality of interpolation filtering stages is cascaded together;

based on a first digital signal processing identity, manipulating a first one of the interpolation filtering stages to produce a first equivalent interpolation filtering stage;

based on the first digital signal processing identity, manipulating a second one of the interpolation filtering stages to produce a second equivalent interpolation filtering stage; and simplifying the first and second equivalent interpolation filtering stages to produce at least a simplified portion of the interpolation filter, wherein the simplified portion is operable to provide up-sampling and filtering functions substantially equivalent to the first one and second one of the interpolation filtering stages.

2. The method of claim 1, wherein the partitioning of the interpolation filtering comprises:

partitioning the interpolation filtering into the plurality of interpolation filtering stages, wherein the plurality of interpolation filtering stages includes the first one and second one of the interpolation filtering stages;

establishing a first up-sampling rate for the corresponding up sampling stage of the first one of the interpolation filtering stages;

establishing a second up-sampling rate for the corresponding up sampling stage of the second one of the interpolation filtering stages, wherein a product of the first and second up-sampling rate corresponds to a desired up-sampling rate of the interpolation filter;

generating a first digital filter to attenuate images produced by the corresponding up sampling stage of the first one of the interpolation filtering stages, wherein the first digital filter operates at the first up-sampling rate; and generating a second digital filter to attenuate images produced by the corresponding up sampling stage of the second one of the interpolation filtering stages, wherein the second digital filter operates at the desired up-sampling rate of the interpolation filter.

3. The method of claim 2, wherein the manipulating the first one of the interpolation filtering stages interpolation filtering stage based on a first digital signal processing identity comprises:

rearranging a linear order of components of the first digital filter with respect to the corresponding up sampling stage of the first one of the interpolation filtering stages based on a Noble identity as the first digital signal processing identity to produce the first equivalent interpolation filtering stage.

4. The method of claim 3, wherein the manipulating the second one of the interpolation filtering stages based on a first digital signal processing identity comprises:

rearranging a linear order of components of the second digital filter with respect to the corresponding up sampling stage of the second one of the interpolation filtering stages based on the Noble identity as the first digital signal processing identity to produce the second equivalent interpolation filtering stage.

5. The method of claim 4, wherein the simplifying the first and second equivalent interpolation filtering stages comprises:

mathematically combining at least one of the components of the second digital filter with at least one of the components of the first digital filter to produce an equivalent component.

6. The method of claim 2 further comprises:

generating, as the first digital filter, a first digital comb filter having frequency notches corresponding to the images produced by the corresponding up sampling stage of the first one of the interpolation filtering stages; and generating, as the second digital filter, a second digital comb filter having frequency notches corresponding to the images produced by the corresponding up sampling stage of the second one of the interpolation filtering stages.

7. The method of claim 1 further comprises:

manipulating the at least a simplified portion of the interpolation filter based on a second digital signal processing identity to produce an equivalent of the at least a simplified portion of the interpolation filter; and further simplifying the equivalent of the at least a simplified portion of the interpolation filter to produce a simplified interpolation filter.

8. The method of claim 7, wherein the second digital processing identity comprises:

equating an up-sampling function operating at a first frequency linearly followed by an integration function operating at a second frequency to an integration function operating at the first frequency and sampling an output of the integration function operating at the first frequency at a rate corresponding to the second frequency, wherein the second frequency equals the first frequency times a multiplier.

9. An interpolation filter for use in a plurality of circuits, wherein fabrication of the interpolation filter comprises:

partitioning interpolation filtering into a plurality of interpolation filtering stages, wherein each of the plurality of interpolation filtering stages includes a corresponding up sampling stage and a corresponding filtering stage, and wherein the plurality of interpolation filtering stages are cascaded together;

based on a first digital signal processing identity, manipulating a first one of the interpolation filtering stages to produce a first equivalent interpolation filtering stage;

based on the first digital signal processing identity, manipulating a second one of the interpolation filtering stages to produce a second equivalent interpolation filtering stage; and simplifying the first and second equivalent interpolation filtering stages to produce at least a simplified portion of the interpolation filter design; and fabricating the interpolation filter in accordance with the at least the simplified portion of the interpolation filter design.

10. The interpolation filter of claim 9, wherein the partitioning of the interpolation filtering comprises:

partitioning the interpolation filtering into the plurality of interpolation filtering stages, wherein the plurality of interpolation filtering stages includes the first one and second one of the interpolation filtering stages;

establishing a first up-sampling rate for the corresponding up sampling stage of the first one of the interpolation filtering stages;

establishing a second up-sampling rate for the corresponding up sampling stage of the second one of the interpolation filtering stages, wherein a product of the first and second up-sampling rate corresponds to a desired up-sampling rate of the interpolation filter;

generating a first digital filter to attenuate images produced by the corresponding up sampling stage of the first one of the interpolation filtering stages, wherein the first digital filter operates at the first up-sampling rate; and generating a second digital filter to attenuate images produced by the corresponding up sampling stage of the second one of the interpolation filtering stages, wherein the second digital filter operates at the desired up-sampling rate of the interpolation filter.

11. The interpolation filter of claim 10, wherein the manipulating the first one of the interpolation filtering stages based on a first digital signal processing identity comprises:

rearranging a linear order of components of the first digital filter with respect to the corresponding up sampling stage of the first one of the interpolation filtering stages based on a Noble identity as the first digital signal processing identity to produce the first equivalent interpolation filtering stage.

12. The interpolation filter of claim 11, wherein the manipulating the second one of the interpolation filtering stages based on a first digital signal processing identity comprises:

rearranging a linear order of components of the second digital filter with respect to the corresponding up sampling stage of the second one of the interpolation filtering stages based on the Noble identity as the first digital signal processing identity to produce the second equivalent interpolation filtering stage.

13. The interpolation filter of claim 12, wherein the simplifying the first and second equivalent interpolation filtering stages comprises:

mathematically combining at least one of the components of the second digital filter with at least one of the components of the first digital filter to produce an equivalent component.

14. The interpolation filter of claim 10 further comprises:

generating, as the first digital filter, a first digital comb filter having frequency notches corresponding to the images produced by the corresponding up sampling stage of the first one of the interpolation filtering stages; and generating, as the second digital filter, a second digital comb filter having frequency notches corresponding to the images produced by the corresponding up sampling stage of the second one of the interpolation filtering stages.

15. The interpolation filter of claim 9 further comprises:

manipulating the at least a simplified portion of the interpolation filter based on a second digital signal processing identity to produce an equivalent of the at least a simplified portion of the interpolation filter; and further simplifying the equivalent of the at least a simplified portion of the interpolation filter to produce a simplified interpolation filter.

16. The interpolation filter of claim 15, wherein the second digital processing identity comprises:

equating an up-sampling function operating at a first frequency linearly followed by an integration function operating at a second frequency to an integration function operating at the first frequency and sampling an output of the integration function operating at the first frequency at a rate corresponding to the second frequency, wherein the second frequency equals the first frequency times a multiplier.

17. The interpolation filter of claim 9, wherein the plurality of circuits comprises: a radio frequency integrated circuit.

* * * * *